United States Patent
Chen et al.

(10) Patent No.: US 11,538,543 B2
(45) Date of Patent: Dec. 27, 2022

(54) NOISE INJECTION FOR POWER NOISE SUSCEPTIBILITY TEST FOR MEMORY SYSTEMS

(71) Applicant: SK hynix Inc., Gyeonggi-do (KR)

(72) Inventors: Xiaofang Chen, Milpitas, CA (US); Wenwei Wang, San Jose, CA (US); Satish Pratapneni, Milpitas, CA (US)

(73) Assignee: SK hynix Inc., Gyeonggi-do (KR)

( * ) Notice: Subject to any disclaimer, the term of this patent is extended or adjusted under 35 U.S.C. 154(b) by 260 days.

(21) Appl. No.: 16/834,464

(22) Filed: Mar. 30, 2020

(65) Prior Publication Data

US 2021/0304833 A1    Sep. 30, 2021

(51) Int. Cl.
*G11C 29/02* (2006.01)
*G01R 29/08* (2006.01)
*G01R 29/26* (2006.01)

(52) U.S. Cl.
CPC ........ *G11C 29/021* (2013.01); *G01R 29/0871* (2013.01); *G01R 29/26* (2013.01); *G11C 29/025* (2013.01)

(58) Field of Classification Search
CPC ................ G11C 29/021; G11C 29/025; G01R 29/0871; G01R 29/26; G01R 31/3183
See application file for complete search history.

(56) References Cited

U.S. PATENT DOCUMENTS

| | | | |
|---|---|---|---|
| 7,135,895 B2 | 11/2006 | Komura | |
| 9,581,645 B2 | 2/2017 | Sontakke et al. | |
| 10,396,648 B2 * | 8/2019 | Katou | H02M 5/46 |
| 2005/0285655 A1 * | 12/2005 | Komura | G06F 1/04 327/295 |
| 2012/0306395 A1 * | 12/2012 | Hirsch | H01J 61/827 315/200 R |
| 2014/0078815 A1 * | 3/2014 | Hollis | G11C 11/404 365/189.11 |
| 2015/0212145 A1 * | 7/2015 | Liu | G01R 31/2646 324/613 |
| 2018/0138874 A1 * | 5/2018 | Bergsma | H03F 3/21 |
| 2021/0072313 A1 * | 3/2021 | Yavoich | G01R 31/31924 |

* cited by examiner

*Primary Examiner* — Alvaro E Fortich
*Assistant Examiner* — Zannatul Ferdous
(74) *Attorney, Agent, or Firm* — IP & T Group LLP

(57) ABSTRACT

Noise injection systems and methods for conducting power noise susceptibility tests on memory systems, including solid state drives. A noise injection system comprises a power selector to deliver a voltage at a first or second level according to a frequency level indicated by a frequency select signal; a noise signal relay to receive a frequency noise signal and to deliver a low or high frequency noise component of the frequency noise signal according to the frequency level of the frequency select signal; and an amplification assembly, responsive to the frequency select signal and which receives the first or second level voltage based on the frequency level of the frequency select signal, receives and amplifies the high frequency noise component when the frequency select signal indicates a high frequency level, and receives and amplifies the low frequency noise component when the frequency select signal indicates a low frequency level.

20 Claims, 13 Drawing Sheets

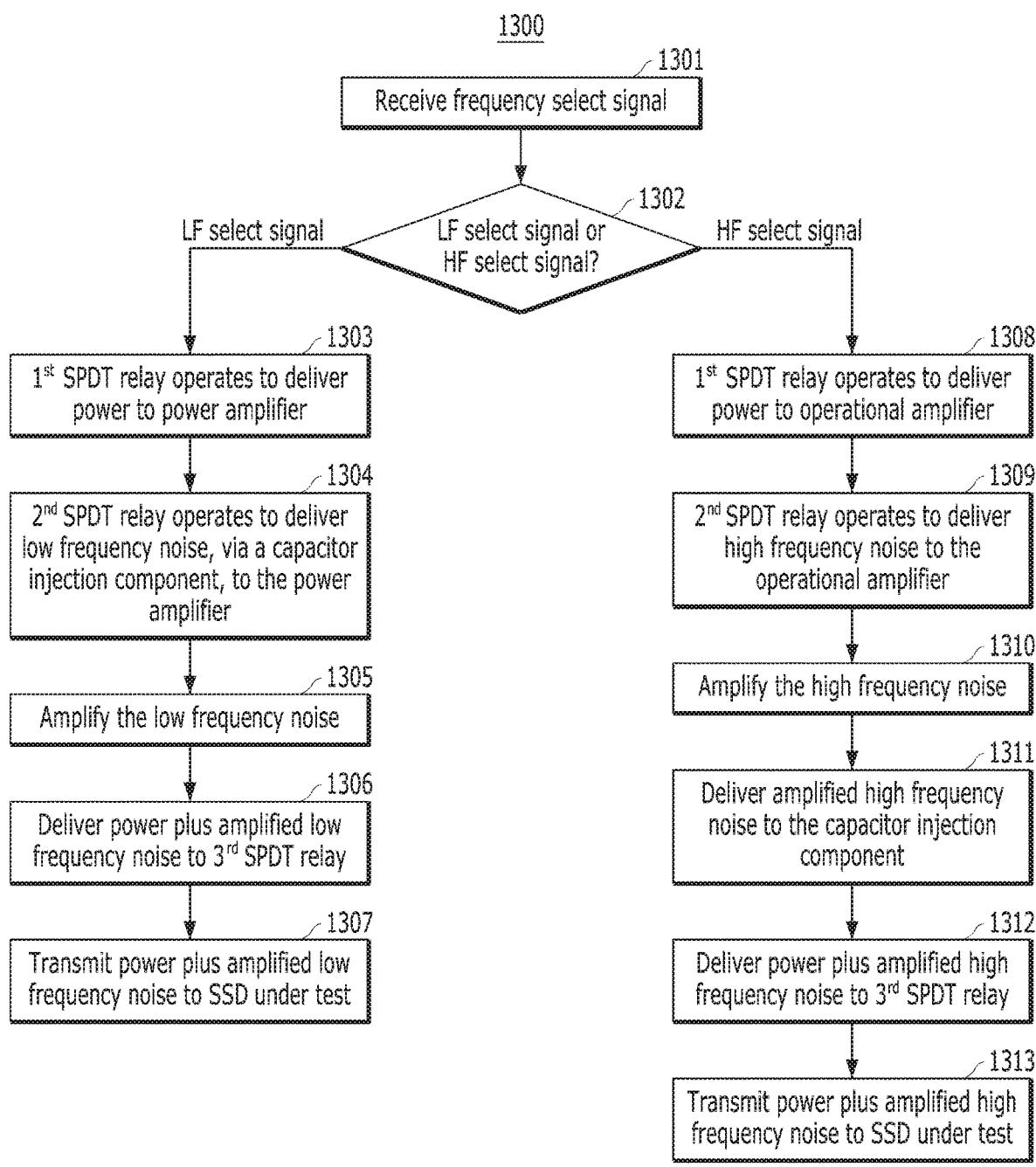

NOISE INJECTION FOR POWER NOISE SUSCEPTIBILITY TEST FOR MEMORY SYSTEMS

BACKGROUND

1. Field

Embodiments of the present disclosure relate to noise injection techniques for conducting power noise susceptibility tests on memory systems, particularly Solid State Drives (SSDs).

2. Description of the Related Art

The computer environment paradigm has shifted to ubiquitous computing that can be used virtually anytime and anywhere. As a result, the use of portable electronic devices, such as mobile phones, digital cameras, and notebook computers has rapidly increased. These portable electronic devices generally use a memory system having memory device(s), that is, data storage device(s). A data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and SSDs.

SSDs, as well as other electronic devices including hard disk drives (HDDs), are typically subjected to power noise susceptibility/injection tests to ensure quality and reliability of the drives/devices for use in different computer or server platforms having a wide range of power supply quality/integrity. Recently, more storage device vendors and users are including such tests in their product specifications.

In theory, the positive power rail (12V, 5V, or 3.3V) to a test circuit used to apply a power noise susceptibility/injection test is modulated with sine/square wave noise of a certain frequency and amplitude, while the device-under-test (DUT), e.g., an SSD, is running multiple input/output (I/O) tests. During the test, the noise frequency is swept from low to high at certain steps (100 Hz, 1 kHz, or 100 kHz, etc.), and each step lasts for a certain time (e.g., 1 min,), while maintaining the same injected noise amplitude (e.g., 100 mV), at the same time the I/O test results and drive status parameters are monitored and logged, Pass or fail is determined by checking errors, failure(s), and occurrence(s) of performance drops. For example, FIG. 4 shows a purposely generated noisy +5V power supply for HDD/SSD test.

However, currently there is no industry standard available, similar to the electromagnetic compatibility (EMC) specification. Moreover, there are significant differences in the testing methods employed. Another challenge is that the high current requirement for SSDs makes noise injection difficult, as most noise sources can only drive a small capacitive load, while a typical SSD represents a relatively large, dynamically combined load, requiring up to several amperes for testing.

In this context embodiments of the present invention arise.

SUMMARY

Embodiments of the present invention provide various noise injection techniques that improve the power noise susceptibility tests of complex SSDs by applying higher noise amplitudes across a wider frequency range.

An aspect of the present invention is directed to a noise injection system that comprises a power amplifier configured to generate a combined voltage and noise signal for injecting noise into a device under test (DUT); a function generator coupled to the power amplifier to deliver voltage boosted noise to a non-inverting input of the power amplifier. The power amplifier is configured to generate the combined voltage and noise signal at substantially the same amplitude across a frequency range of at least 99 kHz.

In another aspect, the present invention is directed to a noise injection system comprising a power selector configured to deliver a voltage at a first level or a voltage at a second level according to a frequency level indicated by a frequency select signal; a noise signal relay configured to receive a frequency noise signal and to deliver a low frequency noise component or a high frequency noise component of the frequency noise signal according to the frequency level indicated by the frequency select signal; and an amplification assembly, responsive to the frequency select signal. The amplification assembly is configured to receive the first level voltage or the second level voltage based on the frequency level of the frequency select signal, receive and amplify the high frequency noise component when the frequency select signal indicates a high frequency level, and receive and amplify the low frequency noise component when the frequency select signal indicates a low frequency level.

In another aspect, the present invention is directed to methods for injecting noise into a device under test (DUT). One such method comprises selecting a first voltage level or a second voltage level according to a frequency level indicated by a frequency select signal; transmitting power at the first voltage level to an amplification assembly when the frequency select signal indicates a low frequency level, and transmitting power at the second voltage level to the amplification assembly when the frequency select signal indicates a high frequency level; delivering a low frequency noise component of inputted frequency noise to a power amplifier of the amplification assembly for amplification when the frequency select signal indicates the low frequency level, and delivering a high frequency noise component of the inputted frequency noise to an operational amplifier of the amplification assembly for amplification when the frequency select signal indicates the high frequency level; and outputting power at the first voltage level and the amplified low frequency noise component when the frequency select signal indicates the low frequency level, and outputting power at the second voltage level and the amplified high frequency noise component when the frequency select signal indicates the high frequency level.

Additional aspects of the present invention will become apparent from the following description.

BRIEF DESCRIPTION OF THE DRAWINGS

FIG. 13 is a flow chart illustrating method of injecting noise into an SSD to perform a power noise susceptibility test in accordance with embodiments of the present invention.

DETAILED DESCRIPTION

Figure 1:
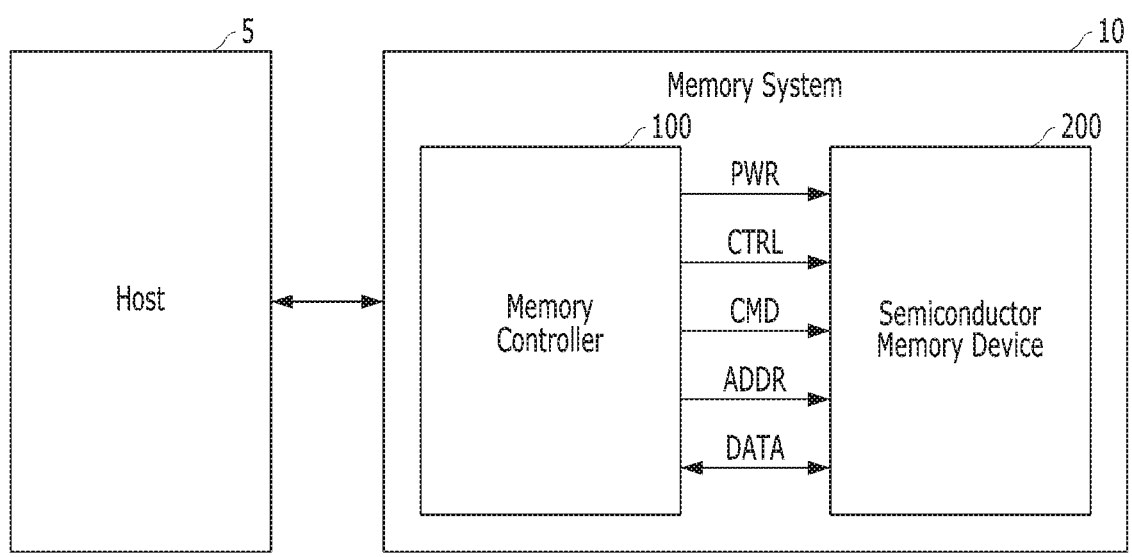
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, a data storage system 2 may include a memory system 10 and a host device 5, which are operably coupled. The memory system 10 may include a memory controller 100 and a semiconductor memory device 200, which may represent more than one such device. The semiconductor memory device(s) 200 may be flash memory device(s), particularly of the NAND-type. For brevity, memory controller 100 and semiconductor memory device 200 are sometimes simply referred to below as controller 100 and memory device 200, respectively.

The controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the memory system 10 is used in an SSD, operation speed of a host (not shown) coupled to the memory system 10 may remarkably improve.

In another embodiment, the memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In still another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
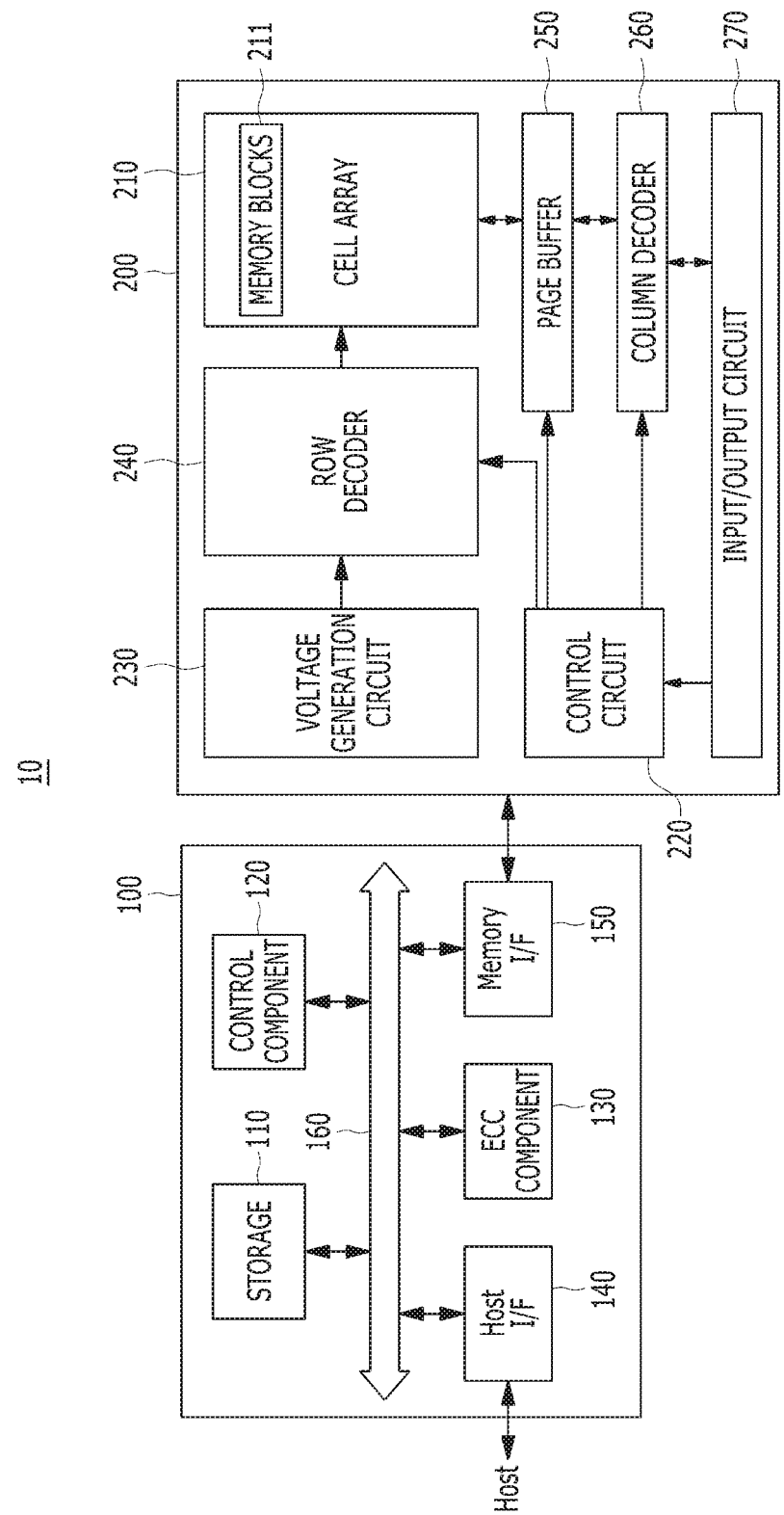
FIG. 2 is a block diagram illustrating details of a memory system in accordance with an embodiment of the present invention.

FIG. 2 is a block diagram illustrating details of a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from the host device 5 (see FIG. 1), and in particular, store data to be accessed by the host device 5.

The host device 5 may be implemented as any of various types of electronic devices. In some embodiments, the host device 5 may include an electronic device, such as a desktop computer, a workstation, a three-dimensional (3D) television, a smart television, a digital audio recorder, a digital audio player, a digital picture recorder, a digital picture player, and/or a digital video recorder and a digital video player.

In some embodiments, the host device 5 may include a portable electronic device, such as a mobile phone, a smart phone, an e-book, an MP3 player, a portable multimedia player (PMP), and/or a portable game player.

The memory device 200 may store data to be accessed by the host device 5.

The memory device 200 may be implemented as a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device 5. The controller 100 may provide data read from the memory device 200 to the host device, and may store data provided from the host device 5 into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented as a volatile memory such as a static random access memory (SRAM) or a dynamic random access memory (DRAM). As described above, the storage 110 may store data used by the host device 5 in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device 5. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure to correct the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM).

The ECC component 130 may include encoders) and decoder(s). More generally, the ECC component 130 may include any and all circuits, systems or devices for suitable error correction operation, in accordance with embodiments of the present invention.

The host interface 140 may communicate with the host device 5 through one or more of various interface protocols, such as a universal serial bus (USB), a multi-media card (MMC), a peripheral component interconnect express (PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device 5. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
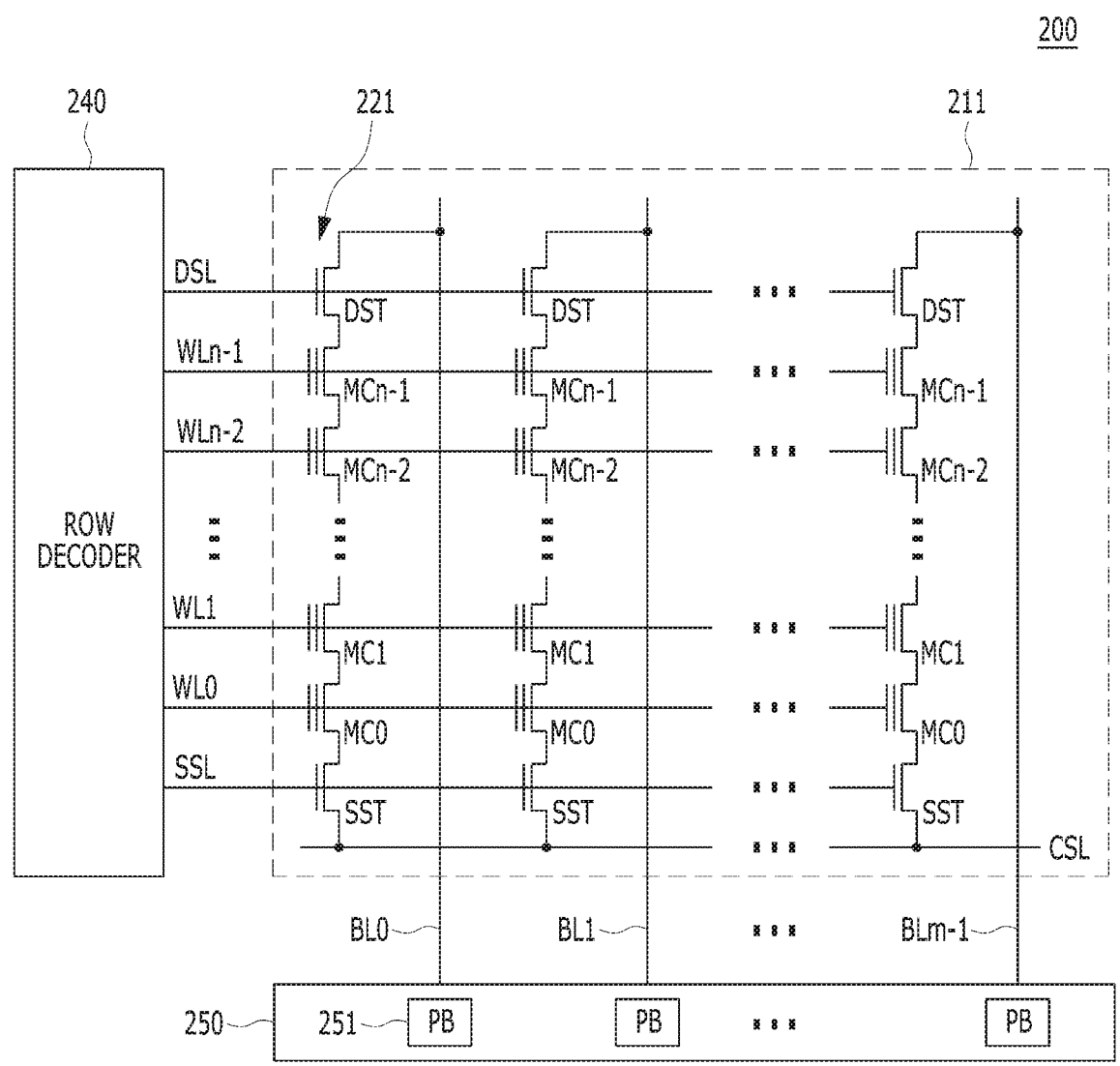
FIG. 3 is a circuit diagram illustrating a memory block of a memory device of a memory system in accordance with an embodiment of the present invention.
Figure 4:
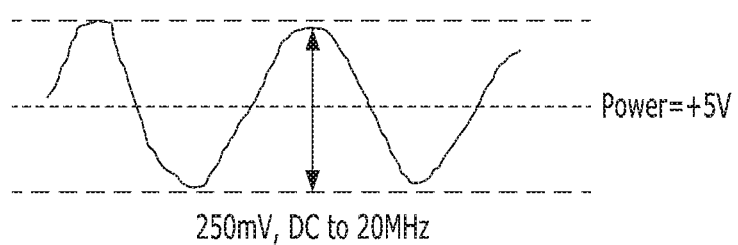
FIG. 4 illustrates a noisy +5V power supply output.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

In an embodiment, the memory block 211 may include a plurality of word lines WL0 to WLn−1, a drain select line DSL and a source select line SSL coupled to the row decoder 240. These lines may be arranged in parallel with the plurality of word lines between the DSL and SSL.

In an embodiment, the memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

As previously noted, embodiments of the present invention provide improved noise injection configurations and methods for performing noise susceptibility tests on memory systems, e.g., SSDs, as well as on other electronic devices. Existing methods have disadvantages as described below in connection with FIGS. 5 and 6.

Figure 5:
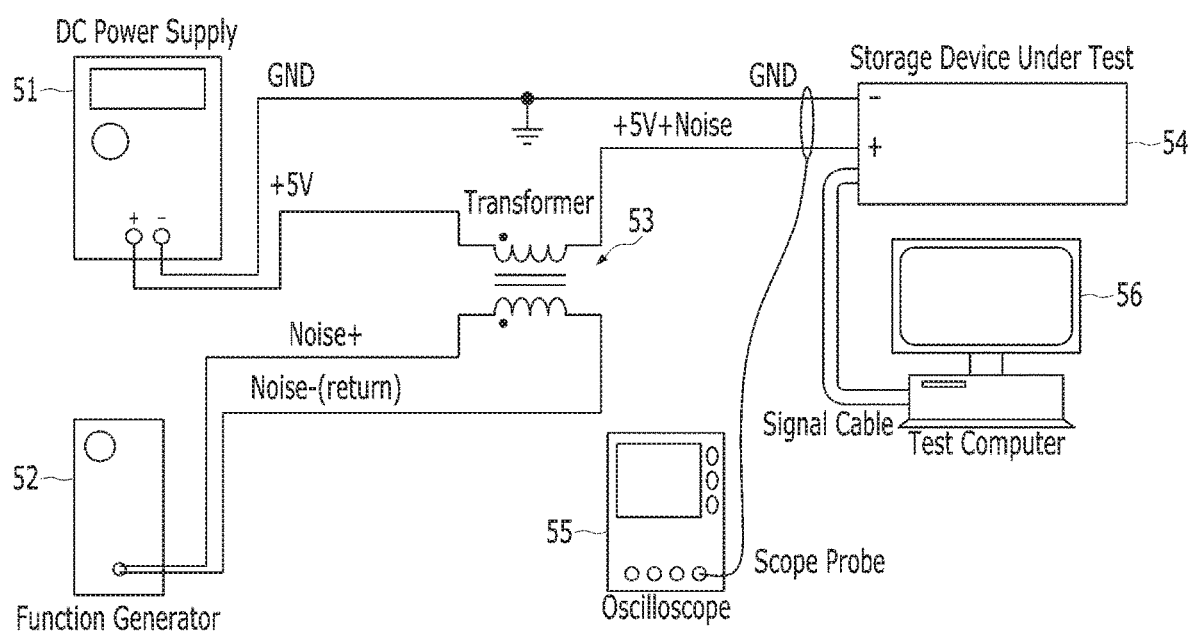
FIG. 5 is a schematic diagram illustrating components for use in a transformer (mutual induction) noise injection technique.

FIG. 5 is a schematic diagram illustrating components for use in a transformer (mutual induction) noise injection technique. As shown in FIG. 5, this method uses a DC power supply 51 and a function generator 52 as the sources for the main power and power noise, respectively. A transformer 53 couples the power noise (Noise+) delivered by the function generator 52 with the power rail (+5V) from the DC power supply 51. The transformer 53 delivers the combined positive voltage and noise (+5V+Noise) to the storage device-under-test (DUT) 54. The ground terminal of the DC power supply 51 is coupled to the ground of the storage DUT 54. An oscilloscope 55 measures the changing voltage (combined positive power supply and power noise) over time. A test computer 56 is coupled to the storage DUT 54.

The design and technique of FIG. 5 has several drawbacks. One drawback is that the frequency response is nonlinear and peaks around mid-frequency and rolls off sharply afterwards. This poses significant challenges for a designer to maintain power noise amplitude in the desired frequency range/band. Another drawback is that the transformer 53 needs to be relatively large. To be effective, the sectional size of the transformer coil needs to be relatively large to avoid current saturation. Also, the transformer 53 needs sufficient coil turns and a large turn ratio between the noise input and power rail.

Figure 6:
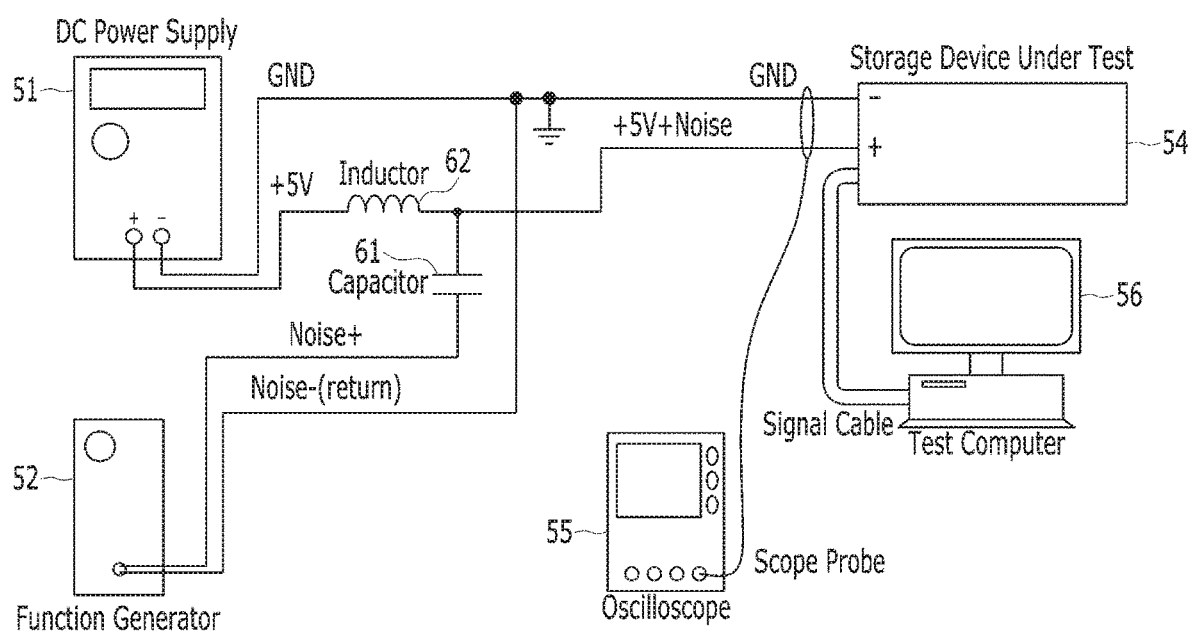
FIG. 6 is a schematic diagram illustrating components for use in a capacitor coupling noise injection technique.

FIG. 6 is a schematic diagram illustrating components for use in a capacitor coupling noise injection technique. This configuration includes several of the same components as the configuration of FIG. 5, namely, the DC power supply 51, the function generator 52, the storage DUT 54, the oscilloscope 55, and the computer 56. The difference between the two configurations is that the configuration of FIG. 6 uses a capacitor 61 to couple the sine wave (Noise+) from the function generator 52 to the positive power (+5V) supplied to the storage DUT 54. The configuration of FIG. 6 may optionally include an inductor 62 to isolate the noise from the power supply itself.

The capacitor 61 of FIG. 6 operates better at higher frequencies (≥100 kHz). One disadvantage is that the capacitor 61 has a weak and nonlinear frequency response.

The method using the construction shown in FIG. 6 is most effective at frequencies higher than 100 kHz, depending on the SSD power input circuit design and capacitor values. Thus, the tester needs to use a very high output amplitude to drive the large capacitive SSD load, because most function generators can only output limited current (less than 200 mA). To make matters worse, output current is even less at higher output frequency. As a result, the measured noise level is usually less than 100 mV, and may not meet requirements.

Accordingly, various improved noise injection configurations/constructions and methods for performing noise susceptibility tests on memory systems, SSDs, as well as on other electronic devices, are provided in accordance with embodiments of the present invention.

Figure 7:
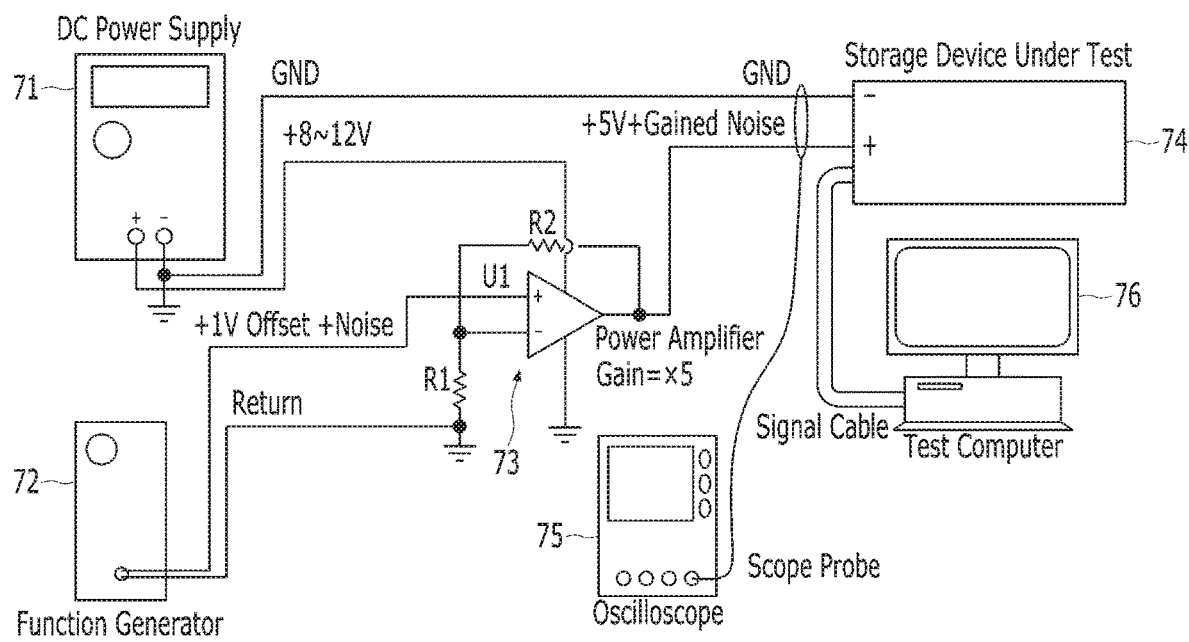
FIG. 7 is a schematic diagram illustrating a noise injector construction and technique in accordance with an embodiment of the present invention.

FIG. 7 illustrates one inventive configuration that employs a power amplifier in accordance with an embodiment of the present invention. This configuration includes a DC power supply 71, a function generator 72, a power amplifier 73, a storage DUT 74, an oscilloscope 75, and a test computer 76. Here, the power amplifier 73 may be a high power operational amplifier (op-amp). Its positive power supply terminal receives the power supply voltage from the DC power supply 71, and the negative power supply terminal of the power amplifier 73 is grounded.

The power amplifier 73 generates the main power and, at the same time, adds increased noise from the function generator 72 to that voltage to yield an output signal (+5V+Gained Noise) that is delivered to the storage DUT 74. To this end, the function generator 72 adds a positive voltage offset, e.g., +1V offset, to noise to produce an increased noise signal (+1V Offset+Noise), which is delivered to the non-inverting input (+) of the power amplifier 73. The inverting input (−) of the power amplifier 73 is coupled to a resistor R1, which is coupled to ground and the return line of the function generator 72. Negative feedback is used by applying a portion of the output voltage via resistor R2 to the inverting input (−) of the power amplifier 73. The feedback is determined by the voltage divider formed by R1 and R2.

Figure 8:
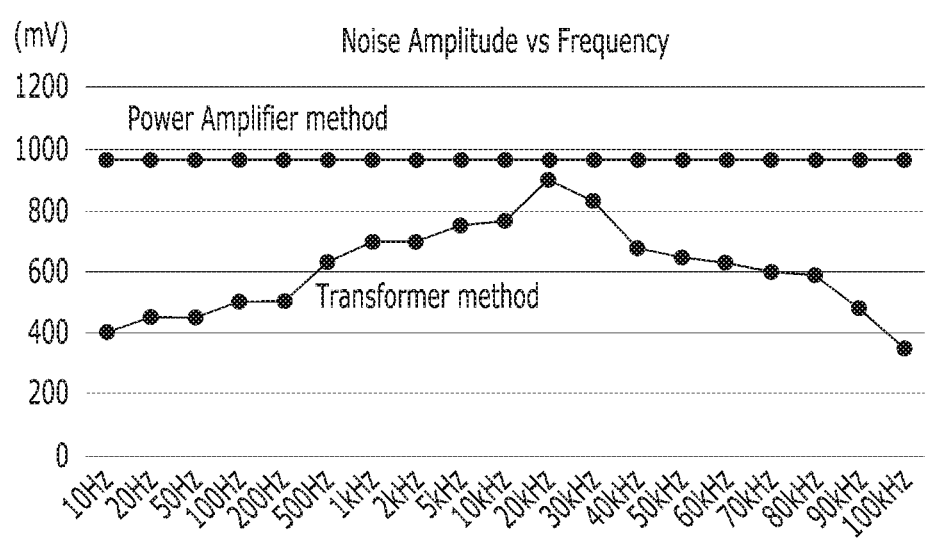
FIG. 8 is a graph showing measured noise amplitude vs. frequency for the construction and technique of FIG. 7 compared with that of FIG. 5.

The inventors have discovered that the configuration and technique of FIG. 7 works very well from DC to 100 kHz, and provides various other improvements. The design and configuration is straightforward, and the output of the power amplifier 73 is readily controllable. The amplitude of the function generator 72 does not need to be very high. The main power noise amplitude is the product of the noise amplitude of the function generator 72 and the gain of the power amplifier 73. The amplitude is mostly flat across the entire bandwidth, which is much better than the transformer design of FIG. 5. FIG. 8 shows a comparison of measured noise amplitude vs. frequency between the design of FIG. 7 (Power Amplifier method) and that of FIG. 5 (Transformer method).

The main power output voltage is the product of the function generator offset and the amplifier gain. The power amplifier 73 is able to output enough current (2~4 A) at selected gain and bandwidth.

A suitable heat sink should be used to dissipate the extra energy due to the voltage difference across IC, i.e., power amplifier 73.

Figure 9:
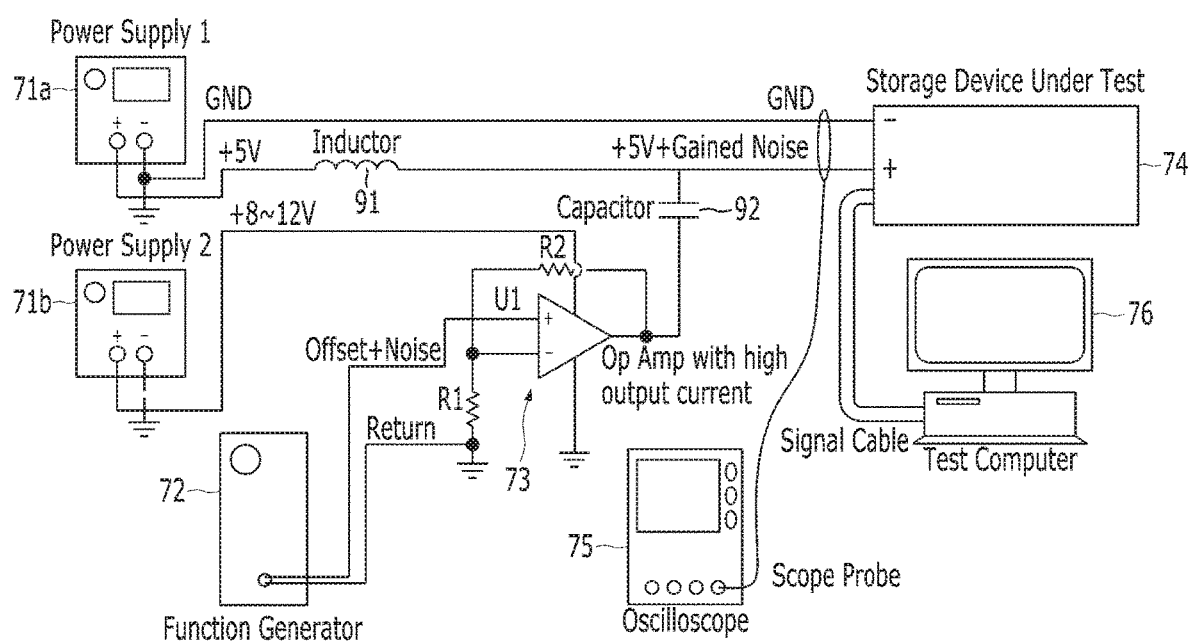
FIG. 9 is a schematic diagram illustrating a noise injector construction and technique in accordance with another embodiment of the present invention.

FIG. 9 illustrates another configuration/construction for injecting noise into a DUT to measure its noise susceptibility, in accordance with another embodiment of the present invention. Similar to the configuration of FIG. 7, the configuration of FIG. 9 also includes a power amplifier. Components in FIG. 9 that are also in FIG. 7 are identified by the same reference numerals. The following description of FIG. 9 primarily focuses on the differences with respect to the configuration of FIG. 7.

The configuration of FIG. 9 includes two power supplies: a first power supply 71a and a second power supply 71b. The configuration of FIG. 9 also includes an inductor 91 and a capacitor 92.

The first power supply 71a is used to supply a positive voltage to the storage DUT 74. The inductor 91 is coupled between the positive voltage terminal of the first power supply 71a and the positive input of the storage DUT 74 to isolate the noise from the first power supply 71a.

The second power supply 71b is used to drive the power amplifier 73. In an embodiment, the second power supply 71b may be configured to deliver between 8 and 12 volts.

Figure 10:
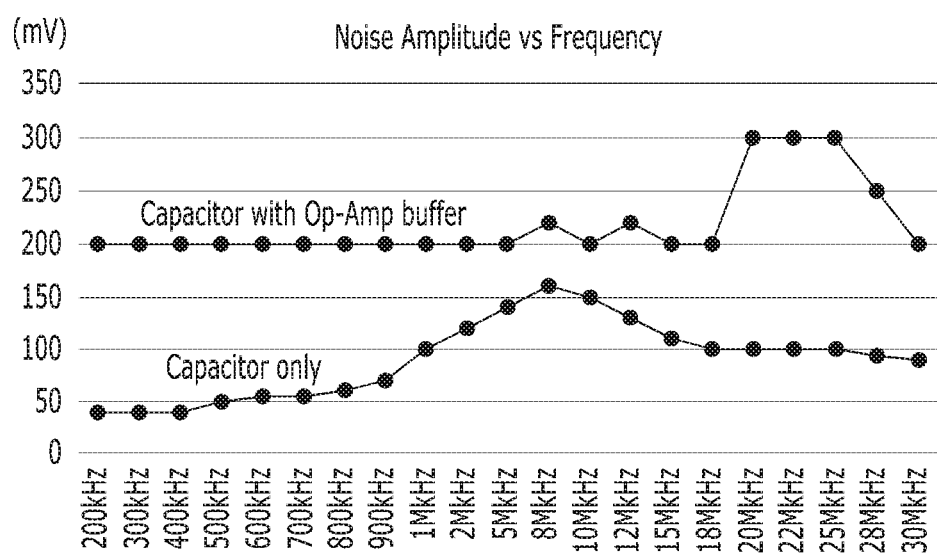
FIG. 10 is a graph showing measured noise amplitude vs. frequency for the construction and technique of FIG. 9 compared with that of FIG. 6.

The capacitor 92 is coupled between the output of the power amplifier 73 and the positive input of the storage DUT 74. Relative to the configuration of FIG. 6, the addition of the power amplifier 73 between the output of the function generator 72 and the coupling capacitor 92 increases the driving ability of the function generator 72 from about 200 mA to 1 A nominally across the entire bandwidth, as shown in FIG. 10. In the noise amplitude vs. frequency graph of FIG. 10, the upper plot (denoted Capacitor with Op-Amp buffer) represents performance of the configuration of FIG. 9, whereas the lower plot (denoted Capacitor only) represents performance of the configuration of FIG. 6.

In the construction of FIG. 9, the power amplifier 73 may be configured as a voltage follower, inverting amplifier or non-inverting amplifier. The power supply to the power amplifier, e.g., second power supply 71b, may be single rail or dual rail, the latter of which may be used to increase the output amplitude to drive a larger load.

Figure 11:
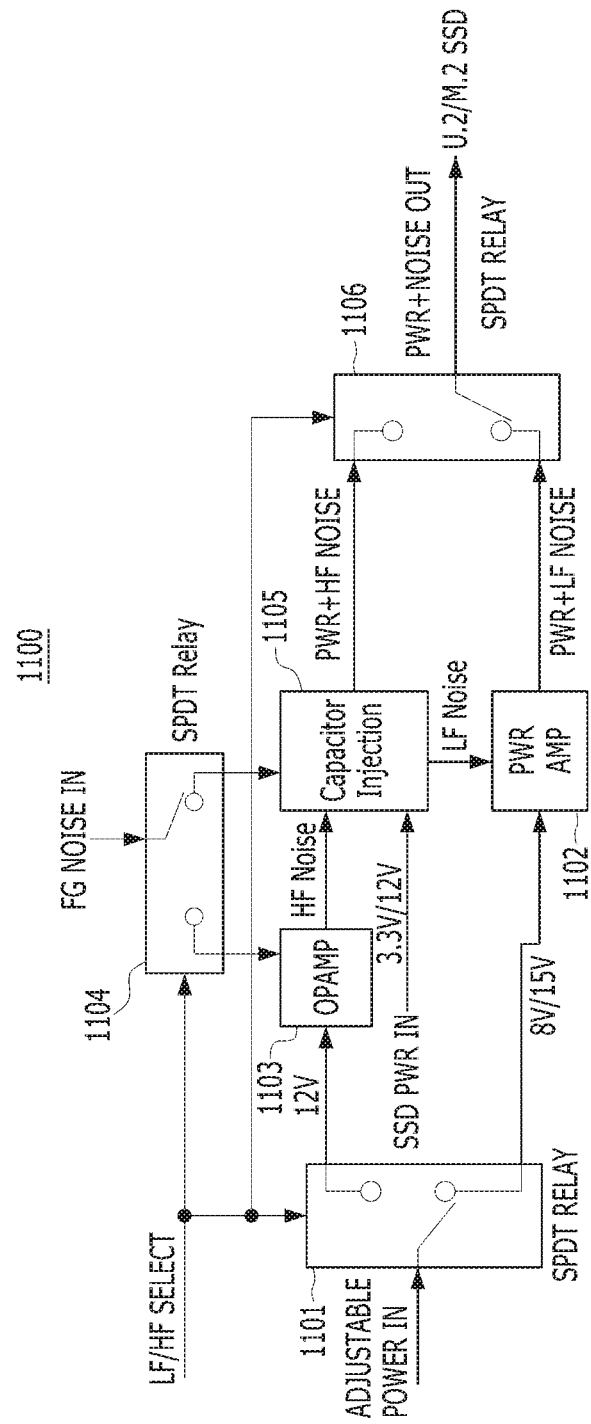
FIG. 11 is schematic diagram illustrating a noise injector construction and technique in accordance with still another embodiment of the present invention.

FIG. 11 is schematic diagram illustrating a new composite full bandwidth (e.g., DC to 30 MHz) noise injector design, construction and technique in accordance with still another embodiment of the present invention. Such design and construction is able to inject noise to SSD power rails with even better performance.

Referring to FIG. 11, the composite noise injector 1100 combines power amplifier direct injection design for low frequencies with operational amplifier buffered capacitor coupling design for high frequencies, using three switches, which may be manually or remotely controlled. This design and construction is dual purpose in that, by adjusting the power supply voltage, it may be used for noise tests performed on both U.2 and M.2 SSDs.

As shown in FIG. 11, the composite noise injector 1100 includes a first single pole double throw (SPDT) relay 1101 that includes an input for receiving power of varying voltages and an input for receiving a low frequency/high frequency select (LF/HF SELECT) signal, which determines whether the composite noise injector 1100 is to operate in a low frequency noise generation mode (low mode) or a high frequency noise generation mode (high mode). The first SPDT relay 1101 includes a switch, which is responsive to the LF/HF SELECT signal, to selectively deliver power to a power amplifier 1102 in low mode and an operational amplifier (op amp) 1103 in high mode. In the illustrated embodiment, the power delivered to the power amplifier 1102 is 8V or 15V, and the power delivered to the op amp 1103 is 12V.

Frequency noise is inputted through a second SPDT relay 1104, the switch of which is also responsive to the LF/HF SELECT signal to selectively deliver high frequency noise to the op amp 1103 or low frequency noise to a capacitor injection component 1105, depending on the mode of operation. During high mode, the capacitor injection component 1105 receives amplified high frequency noise from the op amp 1103. During low mode, the capacitor injection component 1105 delivers the low frequency noise to the power amplifier 1102 for amplification. The capacitor injection component 1105 also has an input for receiving the power that is also supplied to the SSD under test (U.2/M.2 SSD), which power is typically 3.3V or 12V.

The composite noise injector 1100 further includes a third SPDT relay 1106, which is configured to deliver power and low frequency noise or power and high frequency noise to the SSD under test, based on the LF/HF SELECT signal input to the third SPDT relay 1106. More specifically, the third SPDT relay 1106 controls its switch to deliver power plus amplified high frequency noise (PWR+HF NOISE) received from the capacitor injector component 1105 to the SSD under test in high mode, and controls its switch to deliver power plus amplified low frequency noise (PWR+LF NOISE) received from the power amplifier 1102 to the SSD under test in low mode.

Figure 12:
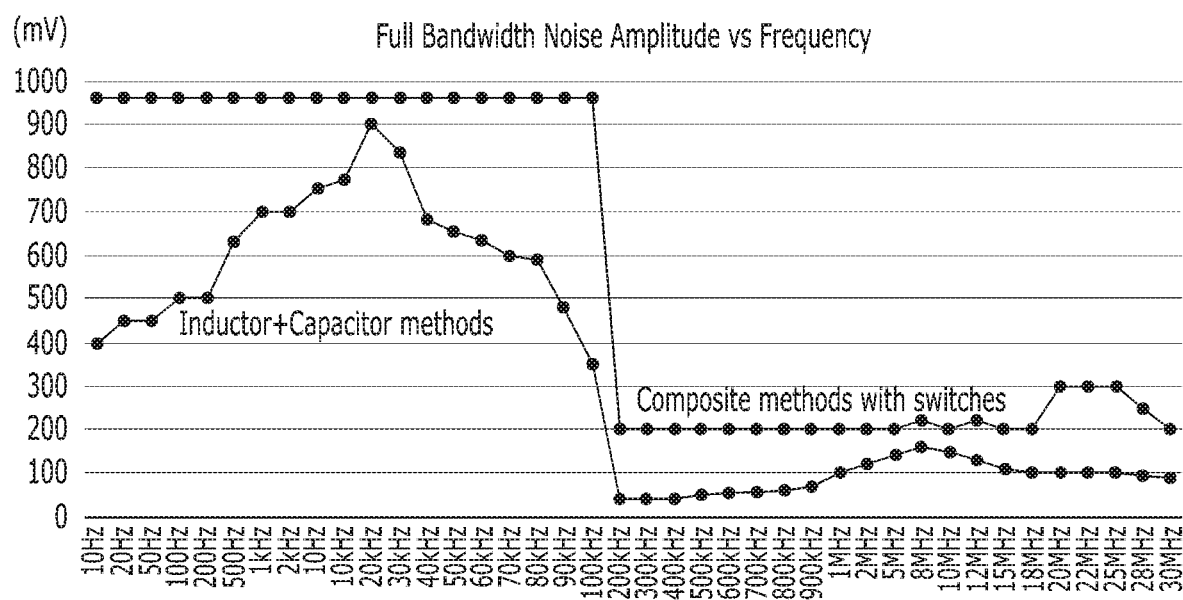
FIG. 12 is a graph showing measured noise amplitude vs. frequency for the construction and technique of FIG. 11 compared with that of FIGS. 5 and 6 combined.

FIG. 12 shows the full bandwidth noise amplitude vs. frequency comparison for U.2 noise injection on +12V. The upper plot shows performance of the composite methods with switches, and the lower plot show performance of the conventional induction and capacitor methods combined.

Compared with conventional noise injector designs, the design and construction of FIG. 11 has advantages. Some of the advantages may include: higher noise amplitude is generated, without over-driving the function generator; a regular or low end function generator can be used because the amplifier circuit increases the driving capability; easier to design and control, with possibility to switch between lower and higher frequencies via remote control; noise amplitude is more linear than conventional design; a load may be driven at very low frequencies (<50 Hz) with excellent amplitude; dual design for U.2 and M.2 SSD makes the test setup and connection easier.

Processing including injecting noise into a DUT using the composite full bandwidth design and technique, according to an embodiment of the present invention, is shown in flow chart 1300 of FIG. 13. Those skilled in the art will understand that additional and/or alternative steps may be performed, or that the order of steps may be changed, to effectuate aspects of the present invention without departing from the inventive concepts disclosed herein. The steps may be performed with the composite noise injector 1100 described above or other component(s) consistent with the description and teachings herein. With that in mind, FIG. 13 is described with reference to other figures, particularly FIG. 11.

Referring to FIG. 13, at step 1301, a frequency select signal is received. At step 1302, it is determined whether the frequency select signal is a low frequency (LF) select signal or a high frequency (HF) select signal. When the low frequency select signal is received, the composite noise injector 1100 operates in low frequency generation mode. In that mode, the low frequency select signal, which is transmitted to each of three SPAT relays, causes each such relay to operate in the low frequency generation mode.

At step 1303, the first SPDT relay, which receives power of varying voltages, operates to deliver power of a specific voltage, e.g., 8V or 15V, to a power amplifier. At step 1304, the second SPDT relay, which receives noise at various frequencies, operates to deliver the low frequency noise component of such noise to a capacitor injection component, which in turn, delivers such low frequency noise to the power amplifier. At step 1305, the power amplifier amplifies the low frequency noise, and at step 1306, the power amplifier delivers power and the amplified low frequency noise to the third SPDT relay, which is in the low mode. As a result, the third SPDT relay transmits the power plus amplified low frequency noise to the SSD under test at step 1307.

Returning to step 1302, when it is determined that the frequency select signal is a high frequency select signal, the composite noise injector 1100 operates in high frequency generation mode. In that mode, the high frequency select signal, which is transmitted to each of the three SPDT relays, causes each such relay to operate in the high frequency generation mode.

At step 1308, the first SPDT relay operates to deliver power of a specific voltage, e.g., 12V, to an operational amplifier. At step 1309, the second SPDT relay operates to deliver the high frequency noise component of the frequency noise received to the operational amplifier. At step 1310, the operational amplifier amplifies the high frequency noise, and at step 1311, delivers the amplified high frequency noise to the capacitor injection component. At step 1312, the capacitor injection component delivers power and the amplified high frequency noise to the third SPDT relay, which is in the high mode. As a result, the third SPDT relay transmits the power plus amplified high frequency noise to the SSD under test at step 1313.

As the foregoing demonstrates, embodiments of the present invention provide various noise injection configurations and techniques that improve the power noise susceptibility tests of systems, particularly complex SSDs, by applying higher noise amplitudes across a wider frequency range. Some embodiments provide a configuration for selectively introducing high or low frequency noise combined with power at a particular voltage level, which configuration may be used for different types of SSDs.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A noise injection system comprising:
   a power amplifier configured to generate a combined voltage and noise signal for injecting noise into a memory data storage device under test (DUT);
   a function generator coupled to the power amplifier to deliver voltage boosted noise to a non-inverting input of the power amplifier,
   wherein the power amplifier is configured to generate the combined voltage and noise signal having substantially the same amplitude across a 99 kHz frequency range.

2. The noise injection system of claim 1, wherein the power amplifier comprises a high power operational amplifier.

3. The noise injection system of claim 1, further comprising:
   a power supply coupled to a positive input of the DUT.

4. The noise injection system of claim 3, further comprising:
   an inductor coupled between a positive voltage terminal of the power supply and the positive input of the DUT.

5. The noise injection system of claim 4, further comprising:
   a capacitor coupled between an output terminal of the power amplifier and the positive input of the DUT.

6. The noise injection system of claim 5, wherein the power amplifier is configured to generate the combined voltage and noise signal at substantially the same amplitude across the 99 kHz frequency range and further across a 4 MHz frequency range.

7. The noise injection system of claim 1, further comprising:
a first power supply coupled to a positive input of the DUT; and
a second power supply coupled to the power amplifier.

8. A noise injection system comprising:
a power selector configured to deliver a voltage at a first level or a voltage at a second level according to a frequency level indicated by a frequency select signal;
a noise signal relay configured to receive a frequency noise signal and to deliver according to the frequency level indicated by the frequency select signal a low frequency noise component when the frequency select signal indicates a low frequency level of the frequency noise signal and a high frequency noise component when the frequency select signal indicates a high frequency level of the frequency noise signal; and
an amplification assembly, responsive to the frequency select signal and configured to
receive the first level voltage or the second level voltage based on the frequency level of the frequency select signal,
receive and amplify the high frequency noise component when the frequency select signal indicates a high frequency level, and
receive and amplify the low frequency noise component when the frequency select signal indicates a low frequency level.

9. The noise injection system of claim 8, further comprising:
an output relay to select power at the first voltage level and the amplified low frequency noise component or power at the second voltage level and the amplified high frequency noise component according to the frequency level indicated by the frequency select signal.

10. The noise injection system of claim 8, wherein the power selector comprises a single pole double throw (SPDT) switch and is configured to receive an input voltage signal at various voltage levels.

11. The noise injection system of claim 8, wherein the amplification assembly comprises a low frequency amplification section and a high frequency amplification section.

12. The noise injection system of claim 11, wherein the low frequency amplification section comprises a power amplifier.

13. The noise injection system of claim 11, wherein the high frequency amplification section comprises an operational amplifier.

14. The noise injection system of claim 13, wherein the amplification assembly comprises a capacitor injection component that is operably coupled to the operational amplifier for processing the high frequency noise component.

15. A method for injecting noise into a device under test (DUT), the method comprising:
selecting a first voltage level or a second voltage level according to a frequency level indicated by a frequency select signal;
transmitting power at the first voltage level to an amplification assembly when the frequency select signal indicates a low frequency level, and transmitting power at the second voltage level to the amplification assembly when the frequency select signal indicates a high frequency level;
delivering a low frequency noise component of inputted frequency noise to a power amplifier of the amplification assembly for amplification when the frequency select signal indicates the low frequency level, and delivering a high frequency noise component of the inputted frequency noise to an operational amplifier of the amplification assembly for amplification when the frequency select signal indicates the high frequency level; and
outputting power at the first voltage level and the amplified low frequency noise component when the frequency select signal indicates the low frequency level, and outputting power at the second voltage level and the amplified high frequency noise component when the frequency select signal indicates the high frequency level.

16. The method of claim 15, further comprising:
delivering the high frequency noise component output from the operational amplifier to a capacitor injection component operably coupled to the operational amplifier when the frequency select signal indicates the high frequency level.

17. The method of claim 15, wherein the delivering is carried out using a relay switch configured to receive the inputted frequency noise and to output one of the low frequency noise component and the high frequency noise component in response to the frequency level of the frequency select signal.

18. The method of claim 15, wherein the outputting is carried out using a relay switch.

19. The method of claim 15, wherein the selecting and transmitting is carried out using a relay switch that is configured to receive an input voltage signal at various voltage levels.

20. The method of claim 15, wherein the low frequency level has a range of about 200 kHz and the output is at substantially the same amplitude across the 200 kHz frequency range.

* * * * *